United States Patent [19]
Shinjo et al.

[11] Patent Number: 5,462,795
[45] Date of Patent: Oct. 31, 1995

[54] MAGNETORESISTANCE EFFECT ELEMENT

[75] Inventors: Teruya Shinjo, Uji; Hidefumi Yamamoto, Kobe; Toshihiko Anno; Toshio Takada, both of Kyoto, all of Japan

[73] Assignees: Ube Industries, Ltd., Yamaguchi; Nippon Steel Corporation; TDK Corporation, both of Tokyo; Tosoh Corporation, Yamaguchi; Japan Energy Corporation; NEC Corporation, both of Tokyo; Matsushita Electric Industrial Co., Ltd., Osaka; Seisan Kaihatsu Kagaku Kenkyusho, Kyoto, all of Japan

[21] Appl. No.: 992,500

[22] Filed: Dec. 17, 1992

[30] Foreign Application Priority Data

Dec. 24, 1991 [JP] Japan .................... 3-340801

[51] Int. Cl.⁶ .................... H01L 43/08; B32B 5/16; G11B 5/66
[52] U.S. Cl. .................... 428/332; 428/336; 428/611; 428/674; 428/675; 428/676; 428/678; 428/694 R; 428/694 T; 428/694 TM; 428/694 TS; 428/900; 338/32 R; 338/32 H; 324/207.21; 324/252
[58] Field of Search .................... 428/692, 694, 428/611, 900, 694 T, 694 TS, 694 TM, 332, 336, 694 R, 674, 675, 676, 678; 338/32 R, 32 H; 324/207.21, 252

[56] References Cited

U.S. PATENT DOCUMENTS

| 5,243,316 | 9/1993 | Sakakima | 338/32 R |
| 5,277,991 | 1/1994 | Satomi | 428/611 |
| 5,315,282 | 5/1994 | Shinjo | 338/32 R |

FOREIGN PATENT DOCUMENTS

| 0503499 | 3/1992 | European Pat. Off. . |
| 0483373 | 5/1992 | European Pat. Off. . |
| 0506433 | 9/1992 | European Pat. Off. . |

OTHER PUBLICATIONS

TDK, Patent Abstracts of Japan, vol. 16, No. 236 (E-1210) May 29, 1992.
Baibich et al., Physical Review Letters, vol. 61, No. 21, pp. 2472–2475, Nov. 21 (1988).

Primary Examiner—L. Kiliman
Attorney, Agent, or Firm—Wenderoth, Lind & Ponack

[57] ABSTRACT

There is provided a magnetoresistance effect element comprising a substrate and at least two magnetic thin layers which are laminated with interposing a non-magnetic thin layer therebetween on said substrate, wherein adjacent magnetic thin layers through the non-magnetic thin layer have different coercive forces, characterized in that a metal thin film is provided in an interface between at least one of the magnetic layers and the non-magnetic layer which is adjacent thereto, and the metal thin film is made of a substance which is different from that of the adjacent non-magnetic layer.

2 Claims, 2 Drawing Sheets

MAGNETORESISTANCE EFFECT ELEMENT

BACKGROUND OF THE INVENTION

1. Field of the Invention

The present invention relates to a magnetoresistance effect element for reading a magnetic field intensity as a signal in a magnetic recording medium and the like.

A highly practical magnetoresistance effect element is required to have a large resistance change ratio in a small external magnetic field. The magnetoresistance effect element of the present invention has a large resistance change ratio in a small external magnetic field and can be practically used.

2. Description of the Related Art

In these years, a sensitivity of a magnetic sensor and a density of magnetic recording have been increased. With such increase, a magnetoresistance effect magnetic sensor (hereinafter referred to as "MR sensor") and a magnetoresistance effect magnetic head (hereinafter referred to as "MR head") have been vigorously developed.

The MR sensor and the MR head read an external magnetic signal through the resistance change in a reading sensor part comprising a magnetic material. Since a relative speed of the MR sensor or the MR head with a magnetic recording medium does not depend on a reproducing output, a high sensitivity is achieved by the MR sensor and a high output is obtained by the MR head even in case of a high density magnetic recording.

However, with a MR sensor which comprises a conventional magnetic substance utilizing anisotropic magnetoresistance effect such as $Ni_{0.8}Fe_{0.2}$, a magnetoresistance change ratio $\Delta R/R$ (which will be defined below) is only about 2 to 5%. Then, a magnetoresistance effect element having a larger magnetoresistance change ratio is desired.

Recently, it was found that an artificial superlattice film in which directions of magnetization in adjacent magnetic layers are opposite each other such as $[Fe/Cr] \times N$ (wherein N is a repeating number of lamination) induces a large magnetoresistance change (Phys. Rev. Lett., 61, 2472 (1988)). However, with this artificial superlattice film, an external magnetic field at which the maximum resistance change is achieved is very large, namely from ten several kOe to several ten kOe. Therefore, this artificial lattice film as such cannot be practically used.

As described above, the conventional MR sensor and MR head have a small resistance change ratio, and the conventional artificial superlattices such as Fe/Cr require too large external magnetic field to induce the resistance change.

The present inventors invented, as a magnetoresistance effect element which solves the above problems, a magnetoresistance effect element comprising a substrate and at least two magnetic thin layers which are laminated with interposing a non-magnetic thin layer therebetween on said substrate, wherein adjacent magnetic thin layers through the non-magnetic thin layer have different coercive forces, and filed patent applications (Japanese Patent Application No. 3-78824 and PCT/JP91/00671 (WO91/18424) corresponding to U.S. Pat. No. 5,315,282 and EP-A-0 483 373, and Japanese Patent Application No. 3-275354 corresponding to U.S. Ser. No. 07/961,314 and EP Ser. No. 92 11 8123.6).

SUMMARY OF THE INVENTION

An object of the present invention is to provide a magnetoresistance effect element which has a larger magnetoresistance change ratio than that of the magnetoresistance effect elements as disclosed in the above earlier applications.

This object is achieved by optimizing the combination of the magnetic substance and the non-magnetic substance of the earlier applications so that the magnetoresistance change ratio is increased.

According to the present invention, there is provided a magnetoresistance effect element comprising a substrate which may have a buffer layer thereon made of a metal such as chromium, tungsten, titanium, vanadium, manganese and their alloys and the like, and at least two magnetic thin layers which are laminated with interposing a non-magnetic thin layer therebetween on said substrate wherein adjacent magnetic thin layers through the non-magnetic thin layer have different coercive forces, characterized in that a metal thin film is provided in an interface between at least one of the magnetic layers and the non-magnetic layer which is adjacent thereto and the metal thin film is made of a substance which is different from that of the adjacent non-magnetic layer. The metal thin film will be sometimes referred to as an interface metal film.

DETAILED DESCRIPTION OF THE INVENTION

Figure 1:
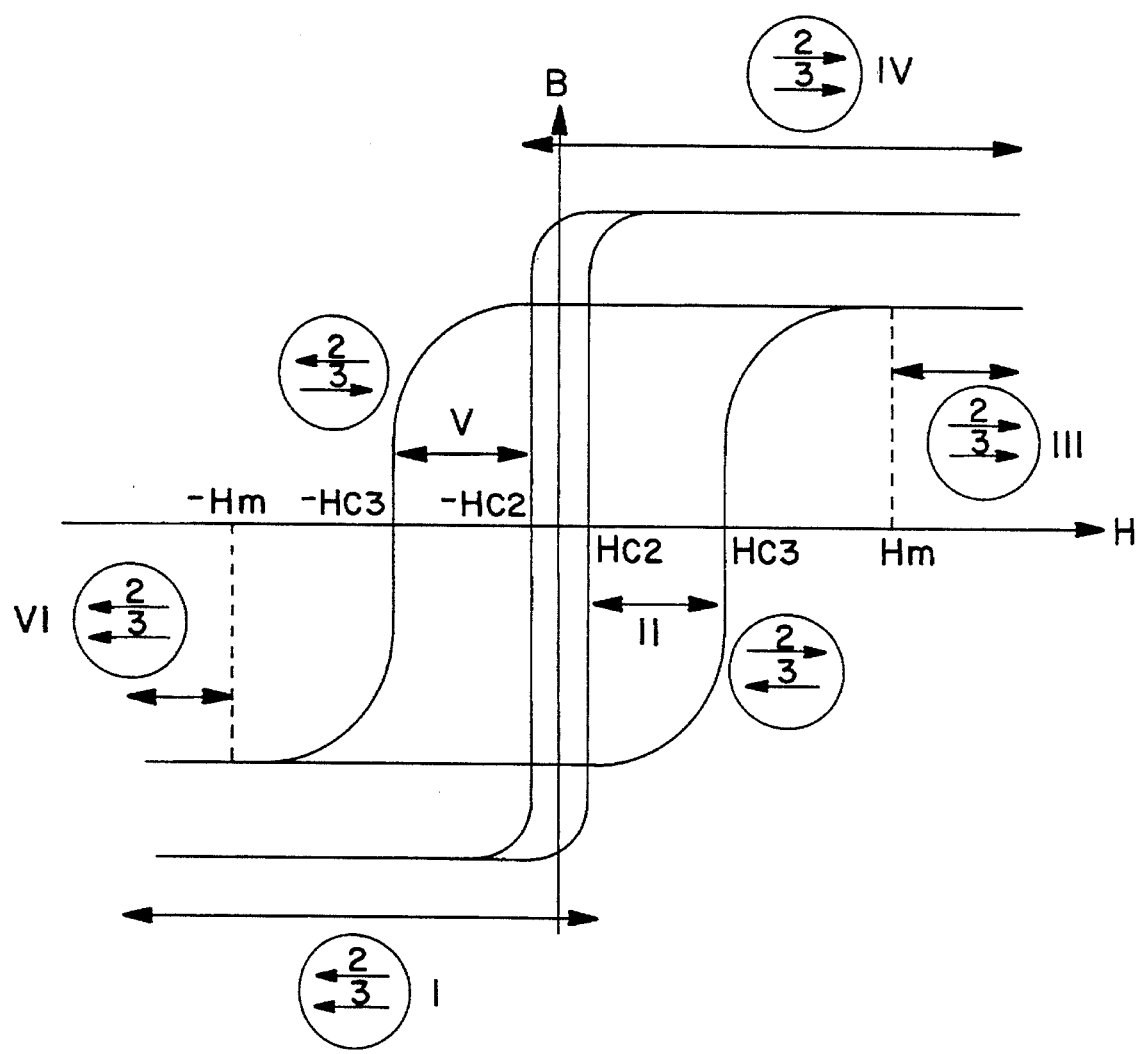
FIG. 1 is a schematic B–H curve which illustrates a function of the magnetoresistance effect element according to the present invention.

In the magnetoresistance effect element of the present invention, it is essential that the adjacent magnetic thin layers through the non-magnetic thin layer have different coercive forces, because the principle of the present invention is based on the fact that, when the directions of the magnetization in the adjacent magnetic layers are different, conduction electrons are scattered depending on spins so that the resistance increases, and when the directions of the magnetization are opposite each other, the element has the largest resistance. That is, in the present invention, as shown in FIG. 1, when an external magnetic field is between a coercive force $Hc_2$ of one magnetic thin layer and a coercive force $Hc_3$ of another magnetic thin layer ($Hc_2<H<Hc_3$), the directions of the magnetization in the adjacent magnetic layers are opposite each other so that the resistance increases.

It is probable that the scattering of the conduction electrons occurs near an interface between the magnetic layer and the non-magnetic layer. In addition, it is known that the magnetoresistance change ratio highly depends on the combination of the magnetic substance and the non-magnetic substance on the scattering, which depends on the spins. For example, it is reported that an artificial superlattice of $[Co/Cu] \times N$ has a magnetoresistance change ratio of about 50%, while an artificial superlattice of $[Fe/Cu] \times N$ has a magnetoresistance change ratio of about 1/7 of that of $[Co/Cu] \times N$.

Recently, a theoretical study states that an artificial superlattice of $[Co_xFe_{1-x}/Cu] \times N$ has a magnetoresistance change which depends on a composition "x" (x is equal to or larger than 0 and equal to or smaller than 1) of a synthesized layer of the superlattice, and a maximum magnetoresistance change ratio is achieved at x of about 0.5. Thus, by laminating a thin film of other metal on the surface of the magnetic layer, namely by providing a thin layer of other metal in an interface between the magnetic layer and the non-magnetic layer, the magnetoresistance change ratio can be increased while a relationship between the coercive forces of the magnetic layers is maintained.

Even when the interface metal film is made of a non-magnetic material, the same effect as described above is obtained since other combination of the magnetic substance and the non-magnetic substance is achieved.

A kind of the magnetic substance to be used as the magnetic thin layer according to the present invention is not particularly limited. Preferred examples are Fe, Ni, Co, Mn, Cr, Dy, Er, Nd, Tb, Tm, Ce and Gd. As alloys or compounds comprising such an element, Fe—Si, Fe—Ni, Fe—Co, Fe—Gd, Fe—Al—Si (Sendust, etc.), Fe—Y, Fe—Mn, Cr—Sb, Co base amorphous alloys, Co—Pt, Fe—Al, Fe—C, Mn—Sb, Ni—Mn, Co—O, Ni—O, Fe—O, Ni—F, ferrites and the like are preferred.

In the present invention, two or more magnetic substances having different coercive forces are selected from the above substances to form the magnetic thin layers. In addition, at one or more interfaces with the magnetic layer(s), one or more thin magnetic films of other metal (interface metal layers) are formed by laminating them at the interfaces so as to achieve the increased magnetoresistance change ratio. A kind of the metal to be used for the interface metal layer is not particularly limited. Preferred examples are Fe, Ni, Co, Mn, Cr, Cu, Au, Ag, Pt, Dy, Er, Nd, Tb, Tm, Ce and Gd. As alloys or compounds comprising such an element, Fe—Si, Fe—Ni, Fe—Co, Fe—Gd, Fe— Al—Si (Sendust, etc.), Fe—Y, Fe—Mn, Cr—Sb, Co base amorphous alloys, Co—Pt, Fe—Al, Fe—C, Mn—Sb, Ni—Mn, Co—O, Ni—O, Fe—O, Ni—F, ferrites and the like are preferred.

The upper limit of each magnetic thin layer is 200 Å, while the lower limit of the layer thickness is not specifically limited. However, when the layer thickness is less than 4 Å, a Curie temperature is lower than room temperature so that the element cannot be practically used. When the layer thickness is 4 Å or larger, the layer thickness can be easily made uniform, a layer quality is improved and saturation magnetization is not excessively decreased. Though the effect is not deteriorated when the layer thickness is larger than 200 Å, it is not increased as the layer thickness increases, and the production of such a thick layer is wasteful and uneconomical.

The thickness of the metal film which is laminated on the surface of the magnetic layer is from 0.5 to 50 Å. Since it is required that the coercive force under the metal film is not greatly changed, the thickness is preferably about from 0.5 to 10 Å.

The coercive force of each magnetic layer varies with the strength of the external magnetic field applied to the element or the required magnetoresistance change ratio and is selected from the range between about 0.001 Oe and about 10 kOe. A ratio of the coercive forces of the adjacent magnetic layers is from 1.2:1 to 100:1, preferably from 5:1 to 50:1, more preferably from 8:1 to 20:1.

Since the magnetic characteristics of each magnetic thin layer present in the magnetoresistance effect element cannot be directly measured, in general, they are measured as follows:

The magnetic thin layers to be measured are vapor deposited alternately with the non-magnetic thin layers and optionally inserting the thin metal film in the interface between the magnetic thin layer and the non-magnetic thin layer till the total thickness reaches about 200 to 400 Å to produce a sample for measurement, and its magnetic characteristics are measured. In this case, the thickness of each magnetic thin layer, the thickness of each non-magnetic layer and the composition of the non-magnetic layer are the same as those in the magnetoresistance effect element.

The magnetic characteristics of the magnetic thin layer other than the coercive force are not critical. A squareness ratio of the magnetic thin layer having a small coercive force is preferably from 0.9 to 1.0.

The non-magnetic layer acts as a material for decreasing a magnetic interaction between the magnetic thin layers having the different coercive forces and its kind is not particularly limited. The non-magnetic material can be selected from various metallic or semimetallic non-magnetic materials or non-metallic non-magnetic materials.

Preferred examples of the metallic non-magnetic material are Au, Ag, Cu, Pt, Al, Mg, Mo, Zn, Nb, Ta, V, Hf, Sb, Zr, Ga, Ti, Sn, Pb and their alloys. Preferred examples of the semimetallic non-magnetic material are Si, Ge, C, B and a composite material of at least one of these elements and another element. Preferred examples of the non-metallic non-magnetic material are $SiO_2$, SiO, SiN, $Al_2O_3$, ZnO, MgO, TiN and a composite material of at least one of these materials and another element.

A thickness of the non-magnetic thin layer is not larger than 200 Å. When this thickness exceeds 200 Å, the strength of the resistance is determined by the non-magnetic layer(s), so that the scattering effect depending on the magnetic spins is relatively reduced and then the magnetoresistance change ratio is decreased. When this thickness is smaller than 4 Å, the magnetic interaction between the magnetic thin layers becomes too large and generation of the direct magnetically contacting state (pin holes) is unavoidable, so that it is difficult to differentiate the directions of the magnetization of the magnetic thin layers.

A thickness of the metal thin layer as the buffer layer is not critical. Usually, the thickness of the buffer layer is not larger than 200 Å, preferably from 20 to 150 Å, in particular, from 30 to 100 Å. When the thickness of the buffer layer is 200 Å or less, the magnetoresistance change ratio is not deteriorated substantially.

The thickness of each of the metal thin film, the magnetic thin layer and the non-magnetic thin layer can be measured by a transmittance electron microscope, a scanning electron microscope, Auger electron spectroscopy and the like. A crystal structure of the thin layer can be identified by X-ray diffraction, reflection high-energy electron diffraction (RHEED) and the like.

In the magnetoresistance effect element according to the present invention, the number of the laminated artificial superlattice layers (N) is not critical, and is determined according to the desired magnetoresistance change ratio and the like. To obtain a sufficient magnetoresistance change ratio, N is preferably at least 3. As the number of the laminated layers increases, the resistance change ratio increases though the productivity decreases. When N is too large, the resistance of the whole element excessively decreases so that the practical use of the element may be difficult. In general, N is 50 or less.

In the above explanation, two magnetic thin layers having the different coercive forces are used. It is possible to use three or more magnetic thin layers having different coercive forces, whereby two or more external magnetic fields at which the directions of the magnetization are inverted can be set, so that a range of acting magnetic field strength can be increased.

On the surface of the uppermost magnetic thin layer, an oxidation-inhibiting film made of, for example, silicon nitride or silicon oxide may be provided, or a metallic conductive film for the formation of an electrode may be provided.

The thin layer may be formed by vapor deposition, sputtering, molecular beam epitaxy (MBE) and the like. As the substrate, glass, silicon, MgO, GaAs, ferrite, CaTiO and the like can be used.

Now, the relationship among the external magnetic field, the coercive force and the directions of the magnetization is explained.

For simplicity, the explanation will be made by making reference to an element containing two magnetic thin layers (2) and (3) having different coercive forces.

As shown in FIG. 1, the coercive forces Hc of two magnetic layers (2) and (3) are $Hc_2$ and $Hc_3$ ($0<Hc_2<Hc_3$), respectively. First, the external magnetic field H is applied so that H is smaller than $-Hcm$ (Hcm being an external magnetic field at which the magnetization of the magnetic thin layer (3) is saturated). The directions of the magnetization of the magnetic thin layers (2) and (3) are in the same negative (−) direction as that of H. As the external magnetic field is increased, in the region I wherein $H<Hc_2$, the directions of the magnetizations of the both magnetic thin layers are still in the negative direction.

The external magnetic field is increased to the region II wherein $Hc_2<H<Hc_3$, the direction of the magnetization of the magnetic thin layer (2) is inverted so that the directions of the magnetization of the magnetic thin layers (2) and (3) are opposite each other. When the external magnetic field is further increased to the region III wherein $Hcm<H$, the directions of the magnetization of the magnetic thin layers (2) and (3) are both in the positive (+) direction.

Thereafter, when the external magnetic field H is decreased, in the region IV wherein $-Hc_2<H$, the directions of the magnetization of both magnetic thin layers (2) and (3) are still in the positive direction, but in the region V wherein $-Hc_3<H<-Hc_2$, the direction of the magnetization of the magnetic thin layer (2) is inverted to the negative direction so that the directions of the magnetization of the magnetic thin layers (2) and (3) are opposite each other. Further, in the region VI wherein $H<-Hcm$, the directions of the magnetization of the magnetic thin layers (2) and (3) are both in the negative direction. In the regions II and V wherein the directions of the magnetization of the magnetic thin layers (2) and (3) are opposite each other, the conduction electrons are scattered depending on the spins so that the resistance increases.

EXAMPLES

The magnetoresistance effect element of the present invention will be illustrated by making reference to the accompanying drawing.

Figure 2:
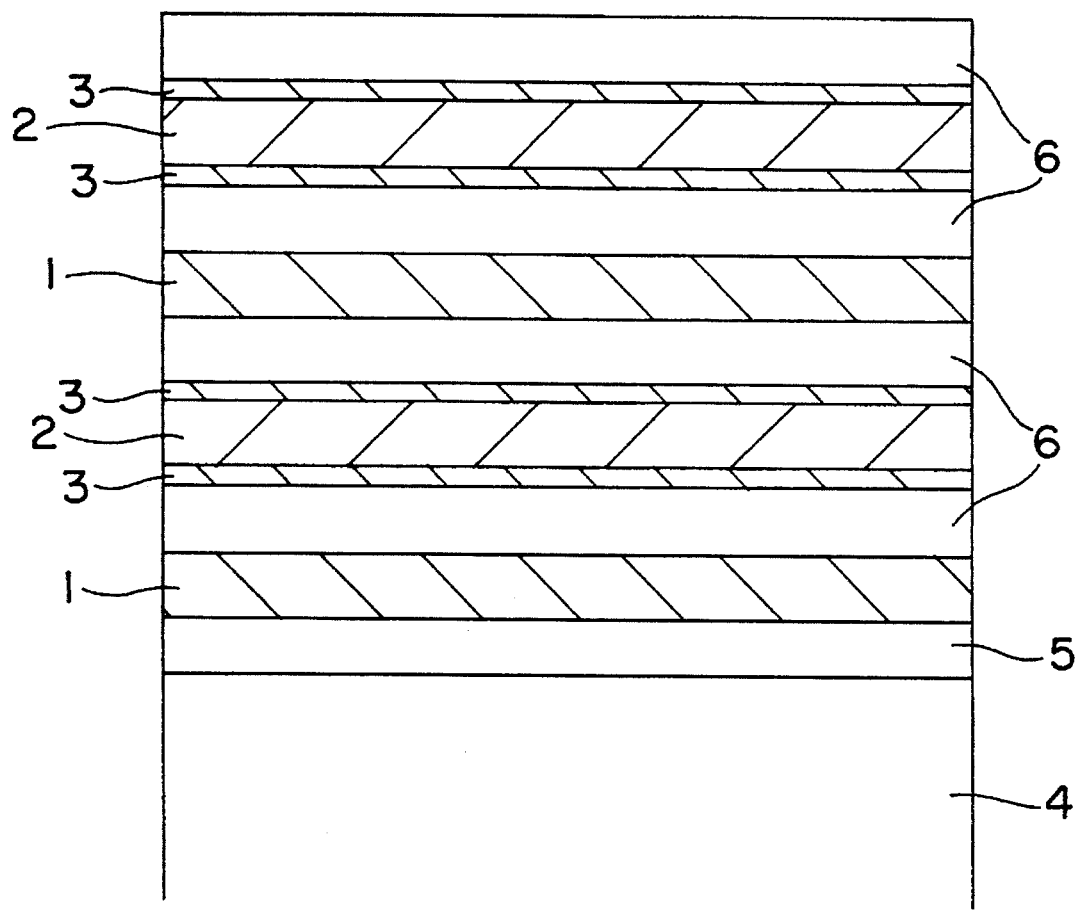
FIG. 2 is a partly omitted cross section of the magnetoresistance effect element according to the present invention.

FIG. 2 is a cross section of an example of the artificial superlattice film of the present invention. In FIG. 2, the artificial superlattice film has magnetic thin layers 1, 2, 1 and 2 on a substrate 4 on which a metal thin layer 5 as the buffer layer has been formed and, between two adjacent magnetic layers having different coercive forces, non-magnetic thin layers 6, 6, 6 and 6. The thin interface metal films 3, 3, 3 and 3 are provided on both sides of the magnetic layers 2 which increase the magnetoresistance change ratio.

For example, when a magnetic substance is selected for the interface metal film 3, the directions of magnetization are inverted by the same external magnetic field since the magnetic layer 2 is laminated on the interface metal film 3, not through the non-magnetic layer. In addition, when a thickness of the interface metal film 3 is made thinner relative to that of the magnetic layer 2, the external magnetic field at which the directions of the magnetic layer 2 and the interface metal film 3 are inverted is almost determined depending on the substance of the magnetic layer 2.

For example, when $Ni_{0.8}Fe_{0.2}$ having a small Hc ($Hc_2$ of about several Oe) is selected as a substance for the magnetic thin layer (2), Co having a slightly larger Hc ($Hc_3$ of several ten Oe) is selected as a substance for the magnetic thin layer (1) and Co is used as the substance for the interface thin metal film 3 on both sides of the magnetic layer 2 so as to increase the magnetoresistance change ratio, it is possible to provide a MR element which has a large magnetoresistance change ratio at a small external magnetic field around the external magnetic field $Hc_2$.

In this example, the interface metal films 3 are provided on both sides of the magnetic layer 2, but they may be further provided on both sides of the magnetic layer 1.

The present invention will be explained by the experimental results.

Example 1 and Comparative Example 1

A glass plate 4 as a substrate was placed in a high vacuum deposition apparatus and the apparatus was evacuated to $10^{-9}$–$10^{-10}$ Torr. While rotating the substrate which was kept at room temperature, a chromium thin film having a thickness of 50 Å was formed as a buffer layer and then an artificial superlattice film having the following composition was formed. The film was grown at a rate of about 0.3 Å/sec.

The compositions and the magnetoresistance change ratios of the multi layer films comprising the magnetic thin layers and the non-magnetic thin layers are shown in Table 1. In Table 1, when the composition is expressed, for example, as Cr(50)[Co(2)/NiFe(10)/Co(2)/Cu(t)/Co(10)/Cu(t)]×5, it means that a thin layer of Co having a thickness of 2 Å, a thin layer of an alloy of 80% Ni and 20% Fe having a thickness of 10 Å, a Co thin layer having a thickness of 2 Å, a Cu thin layer having a thickness of t Å, a Co thin layer having a thickness of 10 Å and a Cu thin layer having a thickness of t Å were successively deposited on the Cr layer having a thickness of 50 Å, and the deposition of these layers was repeated five times. As shown in Table 1, "t" was changed between 32 and 56 Å.

The magnetization was measured by a vibrating sample magnetometer. The dimension of the sample for the magnetoresistance measurement, which had the composition shown in Table 1, was 0.3×10 mm. While applying the external magnetic field in an in-plane direction perpendicular to a direction of an electric current, the resistance was measured by a four prove method by changing the external field from −500 Oe to +500 Oe, and the magnetoresistance change ratio ΔR/R was calculated from the measured resistances. The magnetoresistance change ratio A R/R was calculated according to the following equation:

$$\frac{\Delta R}{R} = \frac{R\max - R\min}{R\min} \times 100\ (\%)$$

wherein Rmax is the maximum resistance and Rmin is the minimum resistance.

For Comparative Example 1, the multi layer film was formed without the Co thin layers on both sides of the NiFe layer and a magnetoresistance change ratio was calculated.

The compositions of the films and the results are also shown in Table 1.

TABLE 1

| Composition of artificial superlattice film | Δ R/R (%) |
|---|---|
| Example 1 (with Co thin films on surfaces of a NiFe layer) | |
| Cr(50)[Co(2)/NiFe(20)/Co(2)/Cu(56)/Co(10)/Cu(56)] × 5 | 8.5 |
| Cr(50)[Co(2)/NiFe(20)/Co(2)/Cu(44)/Co(10)/Cu(44)] × 5 | 10.1 |
| Cr(50)[Co(2)/NiFe(20)/Co(2)/Cu(32)/Co(10)/Cu(32)] × 5 | 9.3 |
| Cr(50)[Co(2)/NiFe(20)/Co(2)/Cu(36)/Co(10)/Cu(36)] × 5 | 12.2 |
| Comparative Example 1 (with no Co thin film on surfaces of a NiFe layer) | |
| Cr(50)[NiFe(20)/Cu(56)/Co(10)/Cu(56)] × 5 | 6.4 |
| Cr(50)[NiFe(20)/Cu(44)/Co(10)/Cu(44)] × 5 | 7.1 |
| Cr(50)[NiFe(20)/Cu(32)/Co(10)/Cu(32)] × 5 | 8.0 |
| Cr(50)[NiFe(20)/Cu(36)/Co(10)/Cu(36)] × 5 | 9.1 |

Example 2

In the same manner as in Example 1, multi layer films having compositions as shown in Table 2 were produced, and the magnetoresistance change ratios thereof were calculated. The results are also shown in Table 2. The alloy of CoFe was 90% Co and 10% Fe, and the alloy of NiFe was 80% Ni and 20% Fe.

TABLE 2

| Composition of artificial superlattice film | ΔR/R (%) |
|---|---|
| Cr(50)[CoFe(2)/NiFe(10)/CoFe(2)/Cu(56)/Co(10)/Cu(56)] × 5 | 8.8 |
| Cr(50)[Cofe(2)/NiFe(10)/CoFe(2)/Cu(44)/Co(10)/Cu(44)] × 5 | 10.6 |
| Cr(50)[CoFe(2)/NiFe(10)/CoFe(2)/Cu(32)/Co(10)/Cu(32)] × 5 | 9.7 |
| Cr(50)[CoFe(2)/NiFe(10)/CoFe(2)/Cu(36)/Co(10)/Cu(36)] × 5 | 12.6 |

What is claimed is:

1. A magnetoresistance effect element comprising a substrate and at least two magnetic thin layers each having a thickness of from 4 to 200 Å which are laminated with interposing a non-magnetic thin layer therebetween on the same side of said substrate, wherein adjacent magnetic thin layers through the non-magnetic thin layer have different coercive forces, characterized in that a metal thin film having a thickness of from 0.5 to 50 Å is provided in an interface between at least one of the magnetic layers and the non-magnetic layer which is adjacent thereto, and the metal thin film is made of a substance which is different from that of the adjacent non-magnetic layer.

2. The magnetoresistance effect element according to claim 1 wherein the substrate has a buffer layer thereon between the substrate and the magnetic thin layer adjacent thereto.

* * * * *